(12) United States Patent
Watanabe et al.

(10) Patent No.: US 7,723,695 B2
(45) Date of Patent: May 25, 2010

(54) IMAGING APPARATUS AND RADIATION IMAGING SYSTEM

(75) Inventors: Minoru Watanabe, Honjo (JP); Chiori Mochizuki, Sagamihara (JP); Takamasa Ishii, Honjo (JP)

(73) Assignee: Canon Kabushiki Kaisha, Tokyo (JP)

( * ) Notice: Subject to any disclaimer, the term of this patent is extended or adjusted under 35 U.S.C. 154(b) by 299 days.

(21) Appl. No.: 11/692,671

(22) Filed: Mar. 28, 2007

(65) Prior Publication Data

US 2007/0228423 A1    Oct. 4, 2007

(30) Foreign Application Priority Data

Mar. 29, 2006  (JP) .............................. 2006-091135
Mar. 16, 2007  (JP) .............................. 2007-068372

(51) Int. Cl.
    *G01T 1/208*    (2006.01)
(52) U.S. Cl. ................................. 250/370.11
(58) Field of Classification Search ............. 250/370.11
    See application file for complete search history.

(56) References Cited

U.S. PATENT DOCUMENTS

| | | | | |
|---|---|---|---|---|
| 5,517,031 A | * | 5/1996 | Wei et al. | 250/370.08 |
| 2004/0245434 A1 | * | 12/2004 | Yokomichi | 250/208.1 |
| 2005/0274991 A1 | * | 12/2005 | Ishii et al. | 257/232 |

* cited by examiner

*Primary Examiner*—David P Porta
*Assistant Examiner*—Shun Lee
(74) *Attorney, Agent, or Firm*—Fitzpatrick, Cella, Harper & Scinto

(57) ABSTRACT

This imaging apparatus has pixels arranged in a matrix shape on a substrate, each of which has a conversion element and the first TFT, wherein the first TFT is connected to the first gate wiring and signal wiring, and the conversion element is connected to bias wiring. The imaging apparatus has the second TFT 6 that is arranged outside a region in which the pixels are arranged. The signal wirings are mutually connected through the second TFT 6 outside a region in which the pixels are arranged. When the apparatus is driven, the second TFT is turned off.

13 Claims, 8 Drawing Sheets

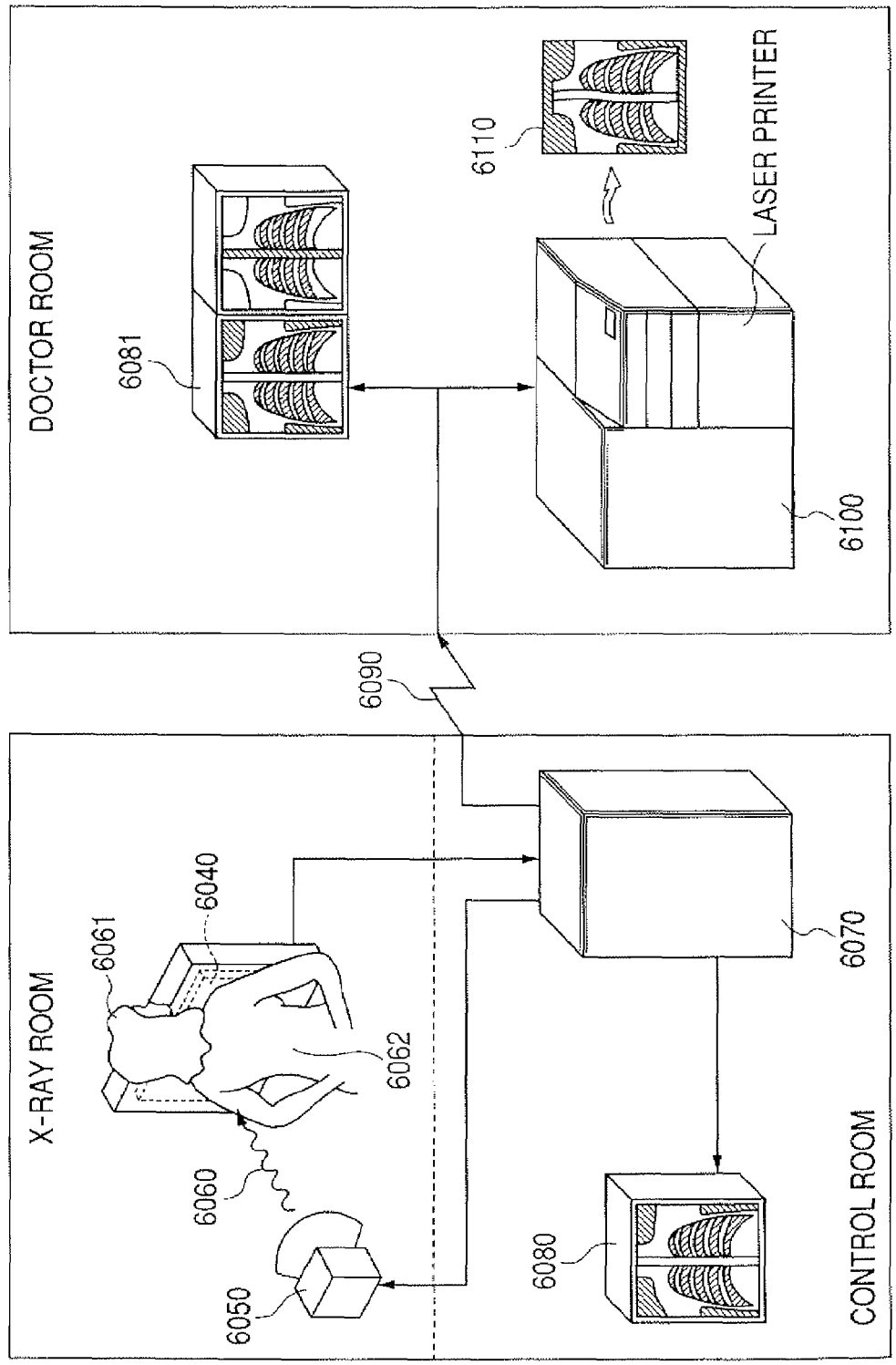

IMAGING APPARATUS AND RADIATION IMAGING SYSTEM

BACKGROUND OF THE INVENTION

1. Field of the Invention

The present invention relates to an imaging apparatus applied to a medical diagnostic imaging apparatus, a non-destructive inspection apparatus and an analysis device using radiation; and a radiation imaging system. In the present specification, the radiation shall include X-rays, alpha-rays, beta-rays and gamma-rays.

2. Description of the Related Art

In recent years, a panel using a thin film transistor (hereafter referred to as "TFT") as a switch element can be mass-produced, because a technology for manufacturing a liquid crystal panel using the TFT has been developed, and an area sensor having a photoelectric conversion element has been used in each field (for instance, X-ray imaging apparatus). A radiation imaging apparatus has characteristics of converting a faint signal digitally and outputting an image, which are different from those of the liquid crystal panel. For this reason, when a substrate is electrically charged in a manufacturing process and a potential difference is formed, for instance, between a signal line and a gate line, a threshold voltage (Vth) of a TFT for reading is shifted and the TFT can not read the faint signal. When the above described potential difference is large, the device is broken, which leads to severe lowering of a yield in a mass production line.

For this reason, U.S. Pat. No. 6,586,769 discloses a method of connecting gate lines (hereafter referred to as "gate wiring") for controlling TFTs to each other, common electrode bias lines (hereafter referred to as "bias wiring") to each other, which control photoelectric conversion elements, and the gate wiring to the bias wiring, all with a semiconductor layer having high resistance. In addition, in a TFT matrix panel before a glass plate is cut, signal wirings are also connected to each other through high resistance.

In the method, when the TFT matrix panel is actually used, the glass plate is cut, and at the same time, signal wirings which have been connected with each other through high resistance are electrically separated. As a result of this, the wiring on the TFT matrix panel after the glass has been cut is electrically independent till a signal processing IC or a source driver is connected. Accordingly, when the panel has received an electrostatic influence from the outside, the panel cannot dissipate static electricity to neighboring wirings, and consequently can not cope with the static electricity.

As a result of this, particularly the signal wiring of the panel is electrostatically loaded, and consequently some or all of TFTs connected to particular signal wiring inevitably causes the shift of Vth. Then, such an apparatus as to manipulate a faint signal recognizes the shift of Vth as the variation of the signal due to a fluctuation of the Vth in the TFT connected to particular signal wiring, or as a sense of incongruity in a captured image. In some cases, the apparatus cannot transfer the signal and causes a line defect.

In addition, U.S. Patent Application Publication No. US-2003-0030054 discloses a method of coping with static electricity.

SUMMARY OF THE INVENTION

However, the method has a problem that the structure becomes complicated. For example, in a structure disclosed in U.S. Patent Application Publication No. US-2003-0030054, at a time of a signal transmitting or at a time of resetting from a signal wiring, according to a voltage of the signal wiring, a discharge device connected to the signal wiring may be turned on. Accordingly, a signal or a reset voltage would likely be not completely transferred due to a leakage. Also, at a step of driving, when Vth of the discharge device is shifted, there would be some ones causing signal leakage among the signal wirings. Thereby, an unnatural would be caused in the image. With regard to a gate wiring, according to a voltage applied thereto, due to a short-circuit to a peripheral discharge element, a sufficient voltage would likely be not applied thereto. Accordingly, when the signal wiring and the gate wiring are connected to the peripheral discharge element, due to signal leakage or insufficient application gate voltage, the unnatural image would be formed.

Accordingly, an object of the present invention is to reduce a sense of incongruity for an image, by preventing electrostatic charges generated in signal wiring from concentrating in the signal wiring, and preventing a threshold voltage of a switch element from shifting.

In the present invention, the present inventors have noted a method of electrically connecting signal wirings to each other, in a process for manufacturing a panel of an imaging apparatus in which pixels each consisting of a pair of a conversion element and a TFT are arranged into a matrix shape. Thereby, the electrostatic charges can flow to neighboring signal wiring even when having been generated, and can be prevented from concentrating in particular signal wiring. The imaging apparatus also needs to disconnect an electrical connection between the signal wirings when a panel is driven, so as not to adversely affect a faint electric current manipulated in the conversion element.

The imaging apparatus also can prevent generated electrostatic charges from concentrating in a particular type of wiring even though the charges are generated, by electrically connecting signal wiring to another type of wiring (such as gate wiring and bias wiring), and passing the charges to the another type of the wiring. As a result of this, the imaging apparatus can avoid a phenomenon in which the charges increase so as to increase a potential difference, for instance, between the upper and lower wirings, even though the whole potential may get higher; can prevent variation in the Vth of a TFT; and can eliminate an adverse effect by static electricity such as dielectric breakdown which may occur in an intersection of the upper and lower wirings.

An imaging apparatus according to the present invention includes: pixels arranged in a matrix shape on a substrate, each of which has a conversion element for converting radiation into an electrical signal and a first switch element connected to the conversion element; a plurality of gate wirings for selecting each of the pixels; a plurality of signal wirings for reading the electrical signal of each of pixels; and a second switch element which is arranged outside the region of the pixels, wherein the signal wirings are mutually connected through the second switch.

The imaging apparatus according to the present invention makes the second switch element connect signal wirings to each other outside the region in which pixels are arranged. Thereby, the imaging apparatus can prevent electrostatic charges generated in signal wiring from concentrating in the signal wiring, prevent a threshold voltage of a switch element from shifting, and reduce a sense of incongruity for an image.

Other features and advantages of the present invention will be apparent from the following description taken in conjunction with the accompanying drawings, in which like reference characters designate the same or similar parts throughout the figures thereof.

BRIEF DESCRIPTION OF THE DRAWINGS

The accompanying drawings, which are incorporated in and constitute a part of the specification, illustrate embodiments of the invention and, together with the description, serve to explain the principles of the invention.

FIG. 8 illustrates a view showing an application of the radiation imaging apparatus according to the present invention to an X-ray diagnosis system.

DESCRIPTION OF THE EMBODIMENTS

In the next place, the best mode for carrying out the present invention will be described in detail with reference to the drawings. An imaging apparatus for converting light such as visible light and infrared light into an electrical signal, and further, a radiation imaging apparatus combining a scintillator layer with the imaging apparatus will be now described.

First Embodiment

At first, an imaging apparatus according to the first embodiment of the present invention will be now described with reference to FIGS. 1 to 5C.

Figure 1:
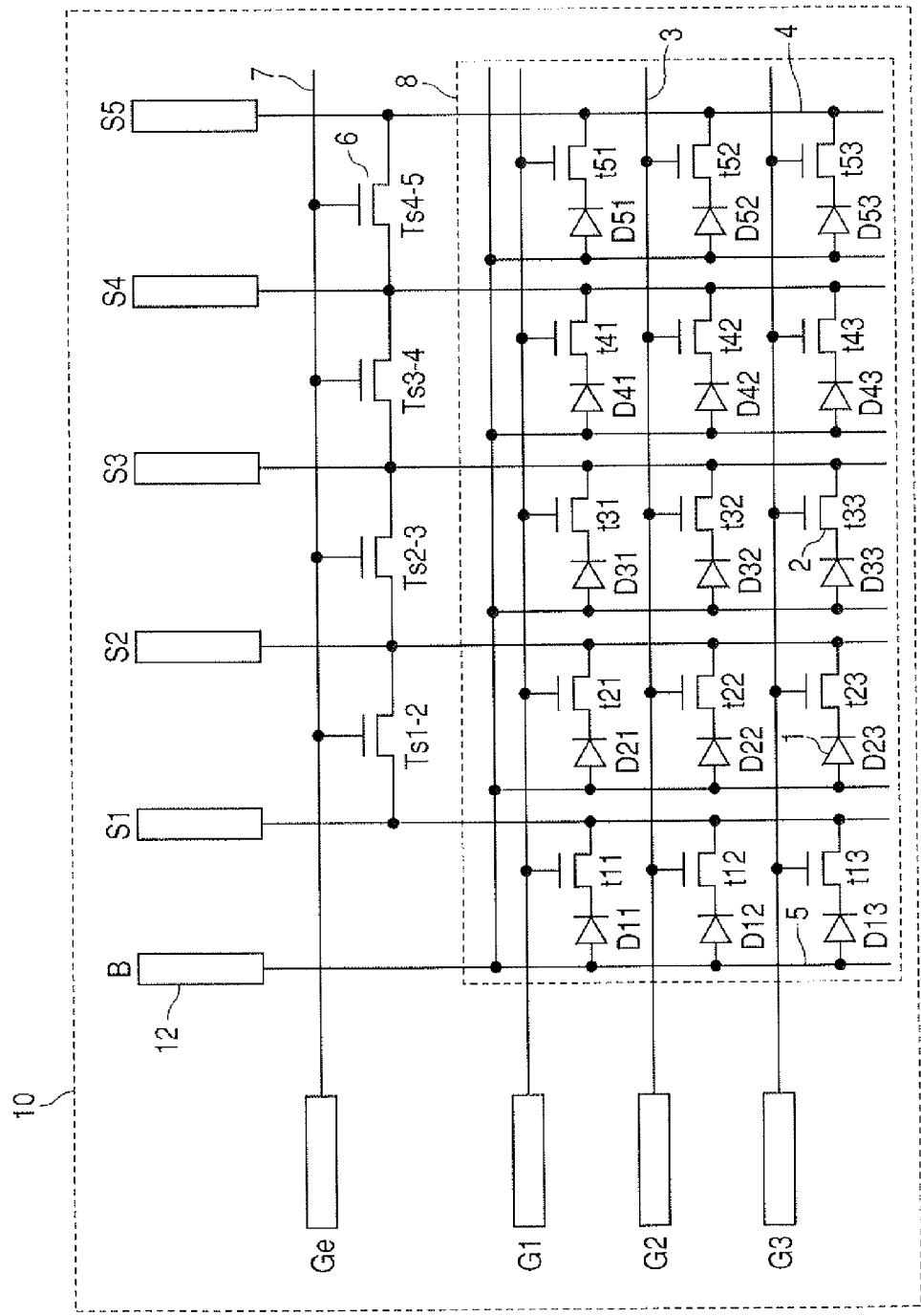
FIG. 1 illustrates a simplified equivalent circuit schematic in an imaging apparatus according to the first embodiment of the present invention.

FIG. 1 is an equivalent circuit schematic in an imaging apparatus according to the first embodiment of the present invention.

In an effective pixel area 8, pixels are arranged into a matrix shape, each of which has a pair of a photoelectric conversion element of a conversion element and a TFT. The pixels illustrated in the drawing are arranged in a rectangular matrix shape of 3 rows by 5 columns, but a size of the effective pixel area 8 may be a square of 1,000 rows by 1,000 columns, for instance. Gate wirings 3 for selecting each of the pixels is arranged on an insulation substrate 10. Signal wirings 4 for reading the electrical signal of each of pixels is arranged on the insulation substrate 10.

A conversion element in the present embodiment is a semiconductor element for converting light such as visible light and infrared light, and radiation such as X-rays, alpha-rays, beta-rays and gamma-rays into an electric signal.

An example illustrated in FIG. 1 employs a PIN type photodiode as a photoelectric conversion element 1, but it is acceptable to employ an MIS type photoelectric conversion element 1.

The figure illustrates only a pattern formed on the insulation substrate 10, but an actual imaging apparatus includes external circuit sections such as a signal processing circuit section and a gate driver circuit section, which are connected to connecting terminals 12 (S1 to S5, B, Ge, G1-G3).

In an effective pixel area 8, pixels are arranged each of which has a pair of a photoelectric conversion element 1 (D11 to D53) and the first TFT 2 (t11 to t53) of a switch element. Signal wiring 4 which is connected to the first TFT 2 is routed to a connecting terminal 12, and then is connected to a signal processing circuit section which is not diagrammatically shown. In addition, the first gate wiring 3 which is connected to the first TFT 2 is routed to the connecting terminal 12, and then is connected to a gate driver circuit which is not diagrammatically shown. On the other hand, bias wiring 5 is connected to a common electrode driver circuit, which is not diagrammatically shown, through the connecting terminal 12.

It is known that when a capacity of signal wiring 4 increases, a ratio S/N decreases in the step of detecting light, because an imaging apparatus manipulates a faint signal. Such an apparatus does not function as a detector, when the signal wirings 4 are connected to each other or the signal wiring 4 is connected to the other wiring, because a faint charge leaks. However, because the imaging apparatus manipulates the faint signal, there is a case where a TFT section connected to particular signal wiring 4 shows different characteristics from those in the other TFT sections, when the signal wiring 4 is electrostatically loaded for instance, and the Vth of the TFT is shifted. As a result of this, an image produces a sense of incongruity. In some cases, the electrostatic load causes even a line defect. Accordingly, it is necessary to connect the signal wirings 4 to each other or connect the signal wiring 4 to the other wiring, thereby dissipate the static electricity which has been generated in a manufacturing process to a perimeter, and reduce damage due to the static electricity.

For this reason, in a circuit example of FIG. 1, signal wirings 4 are connected to each other through second TFTs 6 (Ts 1-2 to Ts 4-5) which are switch elements connected to parts outside an effective pixel area 8. The present invention proposes an imaging apparatus in which damage due to static electricity is thereby reduced. A gate electrode of the second TFT 6 is connected to second gate wiring 7. In the present circuit example, it is desirable to connect wirings with each other through the second TFT 6, in the manufacturing process. However, when connecting the wirings to each other by using the TFT, there is a case where it is allowed to pass an electric current to a source electrode, a drain electrode and a gate electrode, and a case where it is not allowed to pass an electric current to the electrodes, depending on a relative potential among the respective electrodes.

However, a substrate 10 is essentially irradiated with a light emitted from a lighting device such as a fluorescent lamp in a clean room, during a panel manufacturing process. The substrate 10 is also irradiated with a light emitted when plasma is generated in a plasma process such as CVD, sputtering and dry etching, though the light in the clean room does not illuminate a vacuum chamber. When a gate electrode has an on-state voltage at which an electric current passes through the second TFT 6, signal wirings 4 are connected to each other, and the static electricity can be dispersed to a plurality of the signal wirings 4. Accordingly, the Vth of the TFT can be hardly shifted. When a gate electrode has an on-state voltage at which an electric current passes through the second TFT 6, signal wirings 4 are connected to each other, and the static electricity can be dispersed to a plurality of the signal wirings 4. Accordingly, the Vth of the TFT can be hardly shifted.

On the other hand, even when the gate electrode of the second TFT 6 has a turn-off voltage, a semiconductor layer in the second TFT 6 section generates electrons and holes due to emitted light, because the semiconductor layer becomes a depleted layer. Assume that a potential difference is incidentally generated between a source electrode and a drain electrode due to static electricity. However, the electrons and the holes generated by the emitted light flow as an electric current and alleviate the potential difference. As a result of this, particular signal wiring 4 does not change a potential of only itself, but can disperse the static electricity to a plurality of the neighboring signal wirings 4. Accordingly, the imaging apparatus can decrease a shift of the Vth of a TFT connected to the signal wiring 4. A region in which the static electricity is dispersed is expanded as an amount of generated static electricity increases, because the potential difference between a source electrode and a drain electrode in the second TFT 6 also increases. Because the dispersion region thus expands according to the amount of generated static electricity, the imaging apparatus can prevent static electricity from concentrating on one wire, and consequently can decrease a shift of the Vth of a TFT.

As described above, even though a turn-off voltage is applied to a gate electrode of the TFT which is arranged between signal wirings or between the signal wiring and another type of wiring, for instance, in a manufacturing process, the light which irradiates a semiconductor layer in a TFT section is photoelectrically converted into charges, and consequently connects the signal wirings to each other through high resistance. Accordingly, as described above, generated charges by static electricity do not concentrate on the particular signal wiring, and the imaging apparatus can decrease a malfunction caused by the static electricity.

When a panel is actually driven, or the panel is subjected to an electric inspection in a midway of the process, voltage is applied to a connecting terminal 12 shown by Ge to turn off the second TFT 6. Thereby, the imaging apparatus disconnects an electric connection between signal wirings, can detect a faint electric current sent from a photoelectric conversion element, and can be normally driven and inspected. When the TFT is continually turned off while the imaging apparatus is driven, there is a case where the Vth of the second TFT 6 shifts. Accordingly, it is desirable in some cases to control the Vth, by turning the second TFT 6 on at intervals. In addition, when the second TFT 6 is irradiated with light while the panel is driven, the leak between the signal wirings, which is caused by the continual accumulation of the irradiating light, can be reduced by turning the second TFT 6 on and thereby resetting holes or electrons accumulated in a semiconductor layer of the second TFT 6.

Figure 2:
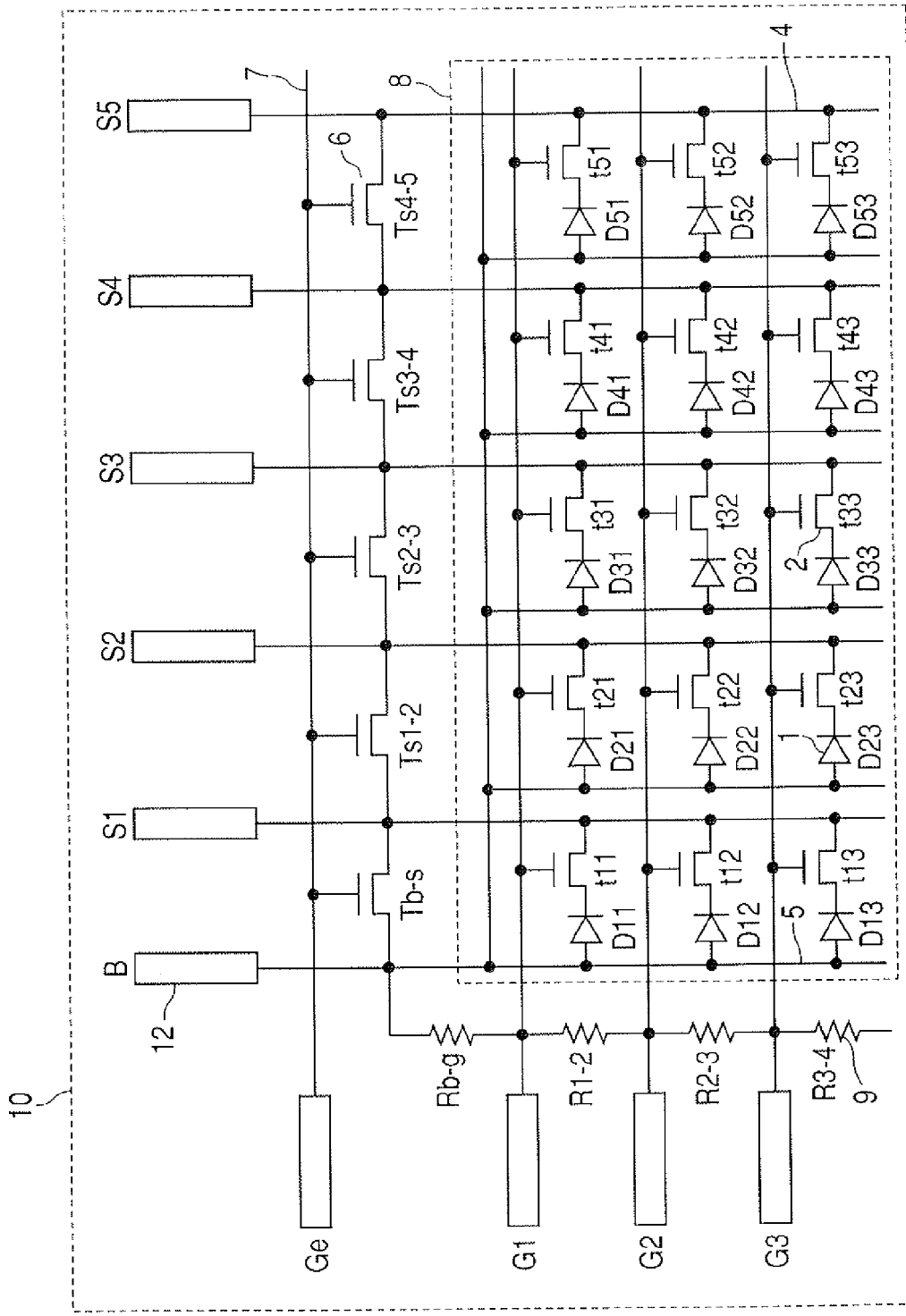
FIG. 2 illustrates a simplified equivalent circuit schematic of another example in the imaging apparatus.

FIG. 2 illustrates a simplified equivalent circuit schematic in an imaging apparatus according to the first embodiment of the present invention, and illustrates a different circuit example from that in FIG. 1.

The equivalent circuit schematic in FIG. 2 has the second TFT 6 arranged not only in between signal wirings 4, but also in between the signal wiring 4 and bias wiring 5, which is different from that in FIG. 1. The bias wiring 5 is connected to one electrode of a photoelectric conversion element 1, and the signal wiring 4 is connected to the bias wiring 5 through the second TFT 6 (Tb-s). The connection makes wires connected to the TFT and wires connected to the photoelectric conversion element 1 into an equal potential, spreads generated static electricity to the periphery, prevents the potential from being locally raised, and acts so as to impart the whole part an equal potential. The signal wiring 4 is connected through the second TFT 6, because the signal wiring 4 manipulates a faint electric current, and accordingly does not function when being connected to the bias wiring 5 through resistance.

On the other hand, first gate wirings 3 need not to be connected to each other through a TFT for control, but are connected through a high-resistance element 9 (R1-2 to R3-4). Then, the imaging apparatus can acquire a structure resistant to static electricity. In addition, all the wirings arranged into a matrix shape can have an equal potential by connecting the first gate wiring 3 to the bias wiring 5 with the high-resistance element 9 (Rb-g).

Figure 3:
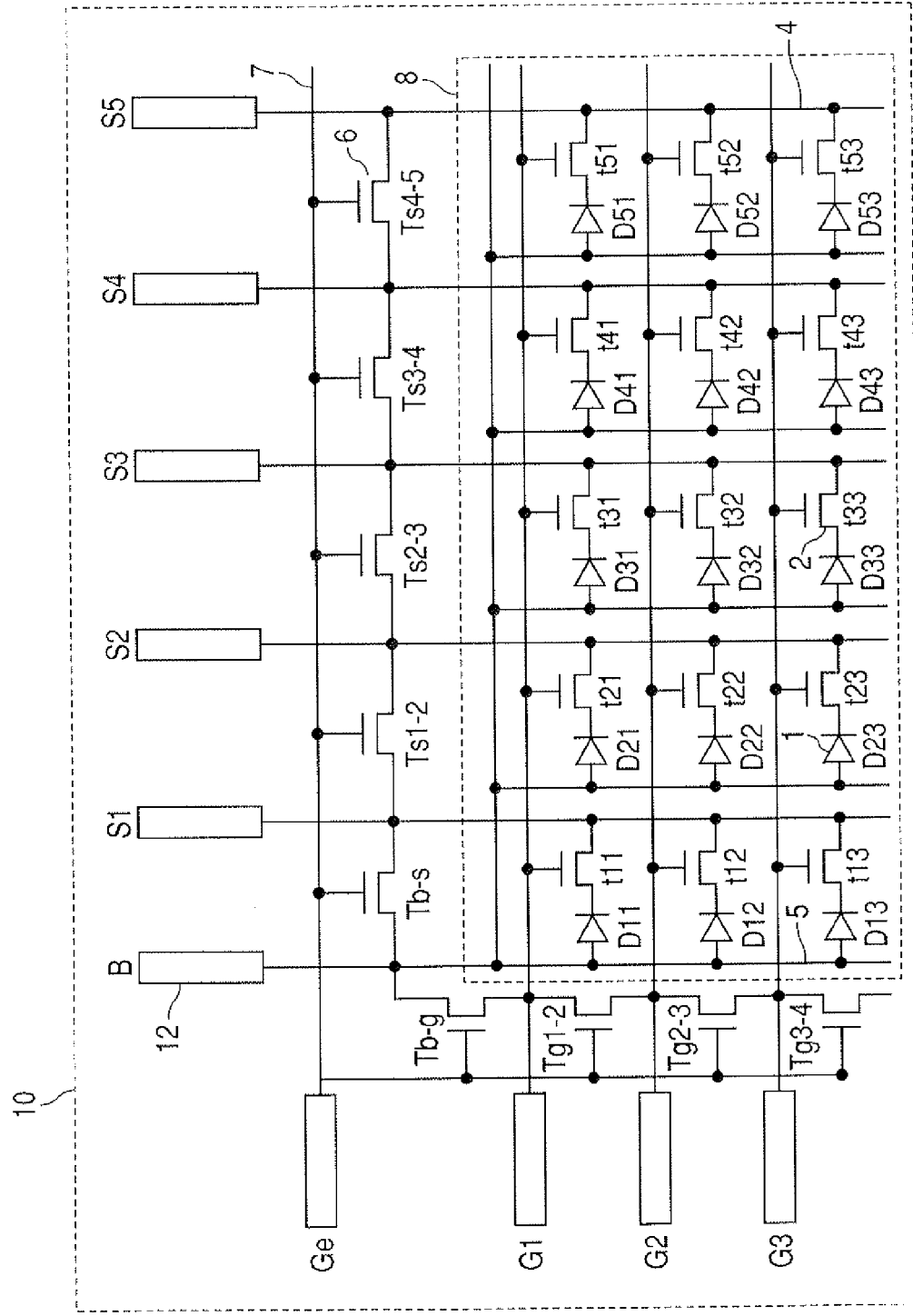
FIG. 3 illustrates a simplified equivalent circuit schematic of another example in the imaging apparatus.

FIG. 3 illustrates a simplified equivalent circuit schematic in an imaging apparatus according to the first embodiment of the present invention, and illustrates a different circuit example from those in FIG. 1 and FIG. 2.

In the circuit example of FIG. 3, the second TFT 6 connects all the wirings to each other, in the outside of an effective pixel area 8. Specifically, the second TFT 6 connects not only signal wiring 4 to bias wiring 5, but also connects the bias wiring 5 to the first gate wiring 3, and the first gate wirings 3 to each other(Tb-g, Tg1-2 to Tg3-4 respectively). Thus configured imaging apparatus can intercept an electric current even between the first gate wirings 3 and between the first gate wiring 3 and the bias wiring 5, by turning the TFT off when the apparatus is driven. An on/off resistance of the second TFT 6 can be determined by adjusting a channel width W and a channel length L of the TFT. Both resistance for tuning-on and turning-off the TFT can be set at a small value by increasing the channel width W and decreasing the channel length L. In the present circuit example, the second TFTs 6 (Ts1-2 to Ts4-5) for connecting the signal wirings 4 which manipulate a faint electric current to each other has smaller connection resistance than the second TFTs 6 (Tg1-2 to Tg3-4) for connecting the first gate wirings 3 which are control wiring to each other. The above method can prevent problems in the drive, and effectively cope with static electricity. Specifically, W/L of the second TFT 6 for connecting the gate wirings to each other can be set at, for instance, 10 times that of the second TFT 6 connecting for the signal wirings 4 to each other. In addition, the second TFT 6 (Tb-g) for connecting the first gate wiring 3 to the bias wiring 5 can be similarly designed.

Figure 4:
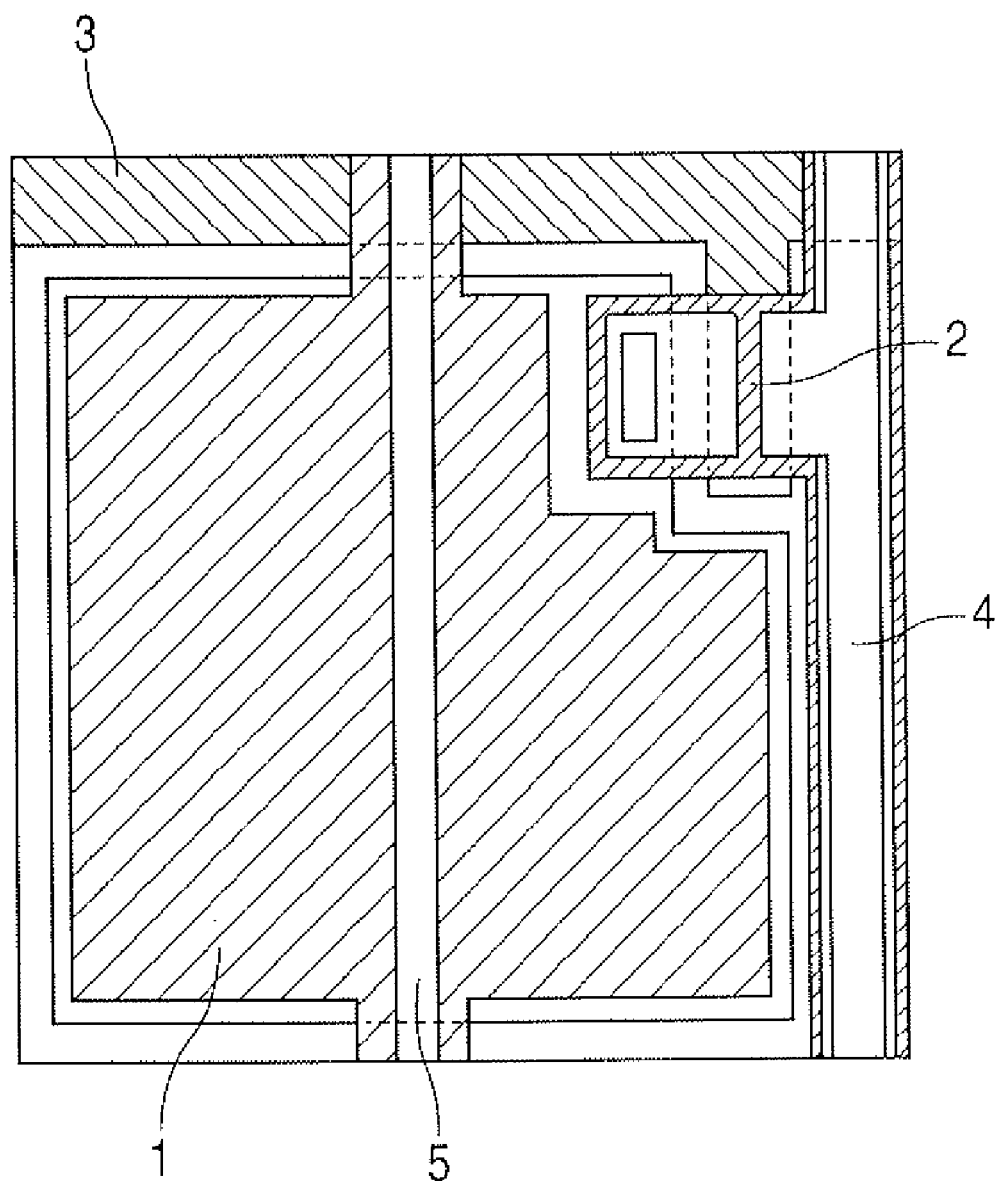
FIG. 4 illustrates a plan view of a pixel in the imaging apparatus.

FIG. 4 illustrates a plan view of a pixel in an imaging apparatus according to the first embodiment of the present invention.

FIG. 4 illustrates a plan view of a pixel having a pair of a photoelectric conversion element 1 and the first TFT 2, in an imaging apparatus according to the present invention. The first TFT 2 is connected to the first gate wiring 3 and signal wiring 4, and a photoelectric conversion element 1 is connected to bias wiring 5. In addition, a bottom electrode of the photoelectric conversion element 1 is connected to a drain electrode of the first TFT 2. The first TFT 2 may be connected to the upper electrode of the photoelectric conversion element 1, and the photoelectric conversion element 1 may be connected to the source electrode of the first TFT 2. In the above structure, when a semiconductor layer used in the photoelectric conversion element 1 is the same semiconductor layer as in the first TFT 2, a manufacturing process can be simplified by using the same semiconductor layer in the second TFT 6 as well which is arranged in a periphery. On the other hand, when the semiconductor layer used in the photoelectric conversion element 1 is different from that use in the first TFT 2, and particularly when a TFT can be formed by using the same semiconductor layer as is used in the photoelectric conversion element 1, the second TFT 6 is formed with the use of the same semiconductor layer as is used in the photoelectric conversion element 1. Thus manufactured imaging apparatus has satisfactory sensitivity to light, and can immediately dissipate static electricity to peripheral wires.

In addition, the second TFT 6 having a large area of a semiconductor layer for detecting light can immediately dissipate static electricity even if having been generated, to neighboring wires through a photocurrent. Accordingly, the second TFT 6 can have a larger area of the semiconductor layer than that in the first TFT 2.

Figure 5A:
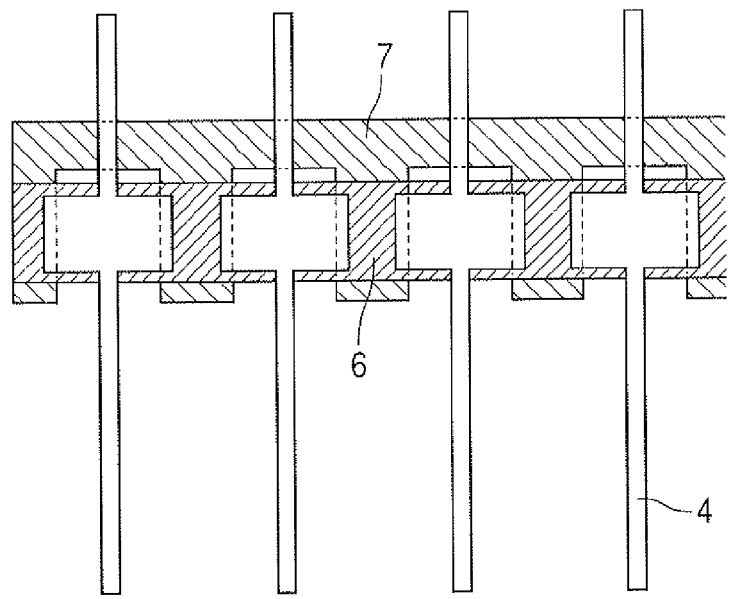
FIG. 5A illustrates a plan view of a main section in the imaging apparatus.
Figure 5B:
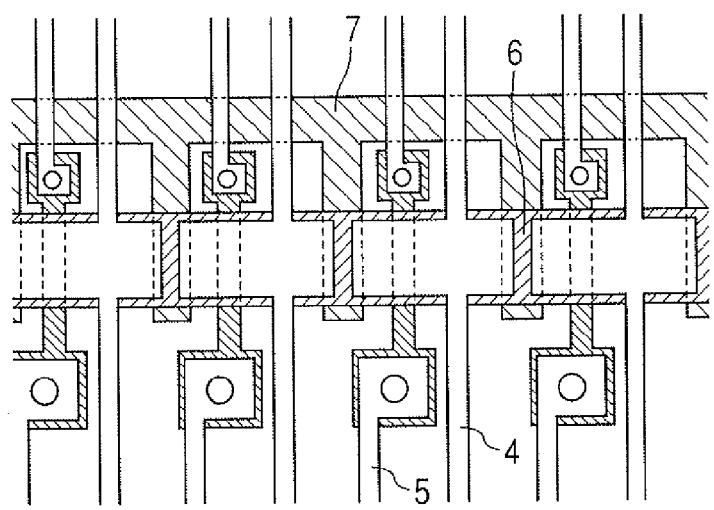
FIG. 5B illustrates a plan view of a main section in the imaging apparatus.
Figure 5C:
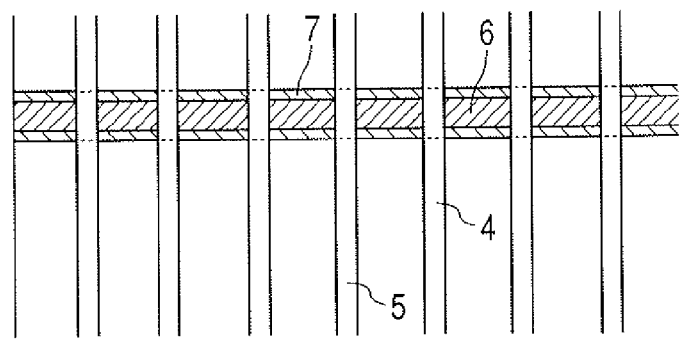
FIG. 5C illustrates a plan view of a main section in the imaging apparatus.

FIGS. 5A, 5B and 5C illustrate plan views of a main section of an imaging apparatus according to the first embodiment of the present invention.

FIGS. 5A, 5B and 5C are plan views illustrating the second TFT 6 according to the present invention. In FIGS. 5A, 5B and 5C, signal wiring routed from a pixel is connected to neighboring signal wiring 4 through the second TFT 6.

FIG. 5A illustrates an example, as being illustrated in an equivalent circuit in FIG. 1, in which a bias wiring 5 is connected commonly in a periphery of an effective pixel area. Only the signal wiring 4 is arranged in the periphery of the second TFT 6. And the second TFT 6 is arranged between the signal wirings 4 to connect them to each other.

FIG. 5B is a view illustrating an arrangement around the second TFT 6, which is different from that in FIG. 5A. In FIG. 5B, bias wiring 5 is arranged in a periphery of a substrate 10; is connected to every signal wiring and every first gate wiring, in the outside of the second TFT 6; and is arranged so as to avoid the second TFT 6, by using the same metallic layer as that used for a pixel illustrated in FIG. 4.

FIG. 5C is a view illustrating an example in which when signal wirings 4 are connected to each other through the second TFT 6, bias wiring 5 is also connected to signal wiring 4 at the same position through the second TFT 6. In FIG. 5C, the signal wirings 4 are connected to the bias wiring 5 through two TFTs.

As described above, there are various methods for connecting wires with the use of the second TFT 6. Any method can inhibit static electricity from giving damage to the imaging apparatus, as long as signal wiring 4 is connected to each other, or to another type of wiring. Accordingly, the imaging apparatus can decrease the shift of the Vth of a TFT connected to the signal wiring 4, a line defect, and consequently the sense of incongruity of an image.

Second Embodiment

In the next place, an imaging apparatus according to the second embodiment of the present invention will be now described with reference to FIGS. 6A, 6B and 7.

Figure 6A:
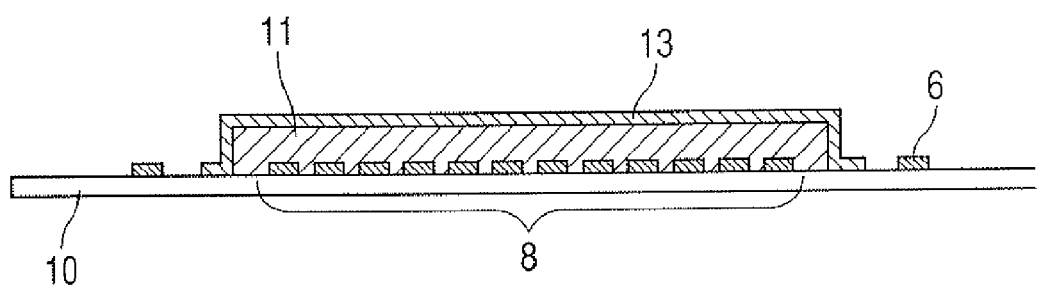
FIG. 6A illustrates a schematic view of a sectional structure in an imaging apparatus according to the second embodiment of the present invention.
Figure 6B:
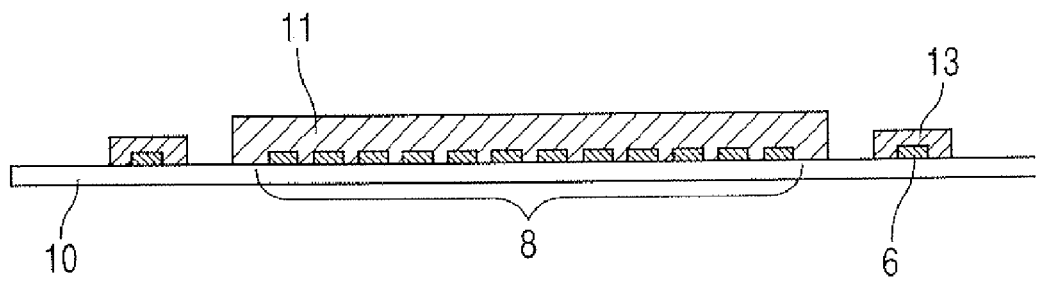
FIG. 6B illustrates a schematic view of a sectional structure in an imaging apparatus according to the second embodiment of the present invention.

FIGS. 6A and 6B illustrate schematic views of a sectional structure in an imaging apparatus according to the second embodiment of the present invention;

An equivalent circuit of the apparatus has the same structure as any one of the equivalent circuits illustrated in FIG. 1 to FIG. 3. Pixels are arranged on a substrate 10 to form an effective pixel area 8. On the upper part of the pixels, a scintillator layer is arranged which is a wavelength conversion layer for converting radiation to such a light that can be photoelectrically converted into an electric signal by a photoelectric conversion element 1 as visible light. The apparatus is used as a radiation imaging apparatus for detecting X-rays or the like. If the scintillator layer 11 is arranged on the second TFT 6 arranged in a perimeter, when the radiation has irradiated the apparatus, the scintillator layer 11 emits light and the light is incident on the second TFT 6. Then, signal wirings 4 are connected to each other through electrons and holes produced in the second TFT 6. As a result of this, leakage occurs between the signal wirings 4 each of which manipulates a faint electric current and lowers the performance of the radiation imaging apparatus.

When such leakage becomes a problem, it is possible to shield the second TFT 6 from the light emitted from a scintillator layer 11, in a final radiation imaging apparatus. Furthermore, when the second TFT 6 causes the leakage of an electric current generated by the light emitted from the scintillator layer 11 in a midway of an inspection step, and lowers the precision of the inspection, it is necessary to shield the second TFT 6 from the light emitted from the scintillator layer 11 before the inspection step. When using visible light such as LED light and organic electroluminescence light in the inspection step before the scintillator layer 11 is arranged, it is necessary to shield the second TFT 6 from the LED light and the organic electroluminescence light. In addition, when the imaging apparatus has not the scintillator 11 arranged therein, it is necessary to shield the second TFT 6 from light incident on a pixel from the outside.

FIG. 6A illustrates a structure in which the scintillator layer 11 is covered with a light shielding layer 13 and the second TFT 6 is arranged on the outside of it so that the light emitted from a scintillator layer 11 can not be incident on the second TFT 6. Even when the light emitted from the scintillator layer 11 reaches the back face of a substrate 10 and irregularly reflects thereon, the TFT can keep its off-state by employing a bottom gate type TFT for the second TFT 6, because a channel section of the second TFT 6 is shielded from the light by the gate electrode. Alternatively, the light shielding layer 13 may be arranged on the back face of the substrate 10.

In addition, FIG. 6B illustrates another structure in which a light shielding layer 13 covers the second TFT 6 to provide the same effect. Both of the light shielding layers 13 are formed in as later step as possible, in a manufacturing process. In addition, each wiring on a TFT matrix panel is electrically independent till a signal processing IC or a source driver is connected to the wiring, as described in an item of problems. For this reason, the TFT matrix panel is susceptible to static electricity when having received an influence of the static electricity from the outside, because the wiring cannot dissipate the static electricity to neighboring wiring. Accordingly, the light shielding layer 13 can be formed after the signal processing IC and the drive IC have been connected to a connecting terminal 12 shown in the first embodiment.

A light shielding layer 13 can employ a metallic film which does not transmit light, or an organic coloring resist superior in application properties, as a material. When employing the metallic film, the film can be connected into a GND potential or a constant potential.

Figure 7:
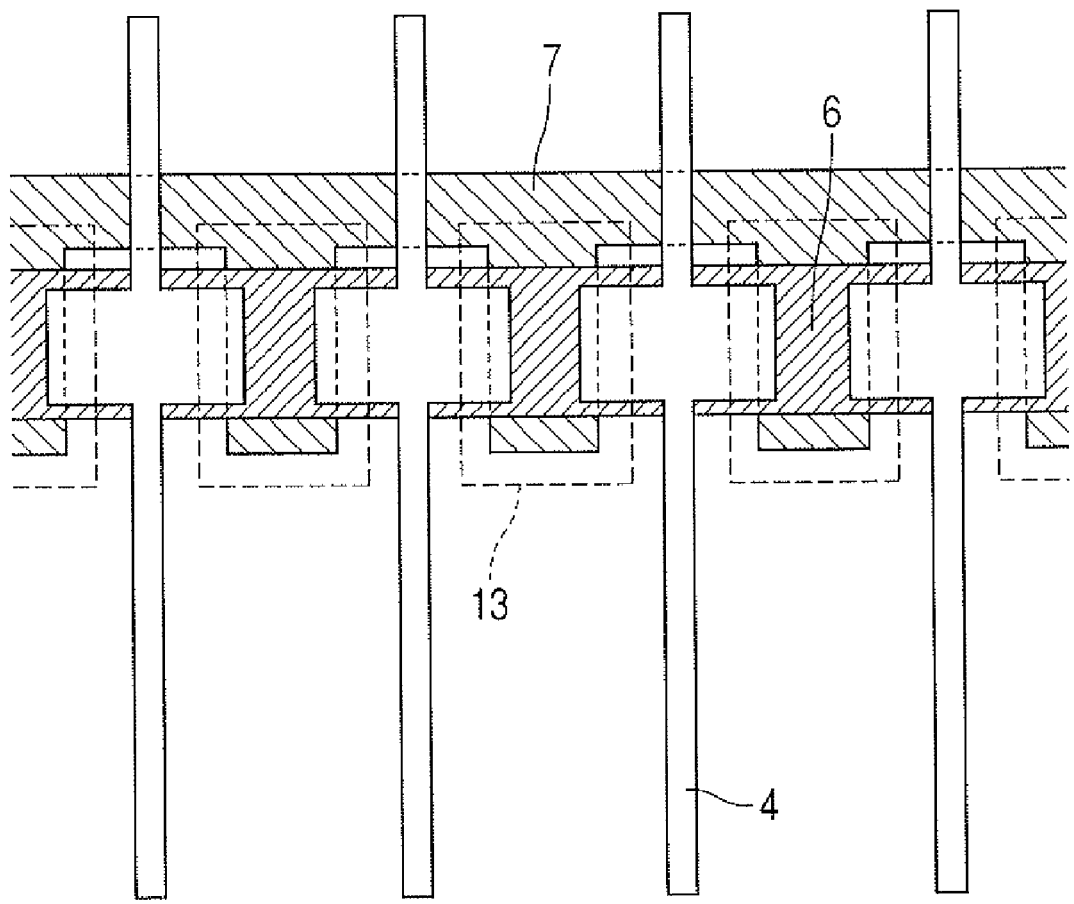
FIG. 7 illustrates a plan view of the second TFT in the imaging apparatus.

FIG. 7 is a plan view of the second TFT 6 in an imaging apparatus according to the second embodiment of the present invention.

FIG. 7 is a plan view illustrating a periphery of the second TFT 6 in FIGS. 6A and 6B. In FIG. 7, signal wiring 4 routed from a pixel is connected to neighboring signal wiring 4 by the second TFT 6. The second TFT 6 has a structure in which a light shielding layer 13 is arranged on the top part of the second TFT 6, and shields the second TFT 6 from the light emitted from a scintillator layer 11, as is illustrated in FIG. 6B.

The imaging apparatus according to the first and second embodiments provides an advantage of reducing the undesirable electrostatic effect even by a simple structure, and provides an advantage of low power consumption.

Third Embodiment

FIG. 8 illustrates an example in which a radiation imaging apparatus according to the present invention is applied to an X-ray diagnosis system which is a radiation imaging system.

X-rays 6060 generated in an X-ray tube 6050 pass through a thorax 6062 of a patient or a subject 6061, and is incident on an imaging apparatus 6040 having a scintillator (phosphor) mounted on the upper part. The incident X-rays include information in the inner part of a body of the patient 6061. The scintillator emits light in response to incident X-rays, and the light is photoelectrically converted to electric information. The information is converted into digital signals. The digital signals are image-processed into an image by an image processor 6070 of a signal processing unit. Then, the image can be observed through a display 6080 of a display unit in a control room.

The information can be also transferred to a remote place through a transmission processing unit such as a telephone line 6090, and can be displayed on a display 6081 of the display unit arranged in a doctor room in another place, or can be saved in a recording unit such as an optical disk. Thereby, a doctor at a remote place can examine a patient. It is also possible to record the information in a film 6110 of a recording medium by using a film processor 6100 of a recording unit.

As many apparently widely different embodiments of the present invention can be made without departing from the spirit and scope thereof, it is to be understood that the invention is not limited to the specific embodiments thereof except as defined in the claims.

This application claims the benefit of Japanese Patent Application Nos. 2006-091135, filed Mar. 29, 2006, and 2007-068372, filed Mar. 16, 2007, which are hereby incorporated by reference herein in their entirety.

What is claimed is:

1. An imaging apparatus comprising:
   pixels arranged in a matrix shape on a substrate, wherein each of the pixels has a conversion element for converting radiation into an electrical signal, and a first switch element connected to the conversion element for transferring the electrical signal of the pixel;
   a plurality of first gate wirings for selecting each of the pixels;
   a plurality of signal wirings for reading the electrical signal of each of the pixels, wherein each of the plurality of signal wirings is connected to the first switch elements in the pixels;
   a plurality of second switch elements which are arranged outside the region of the pixels, wherein each of the plurality of signal wirings are connected with the other signal wirings through the plurality of second switch elements; and
   a light shielding layer of a metal is connected to a constant potential, and is arranged over the second switch elements.

2. The imaging apparatus according to claim 1, wherein a gate electrode of the second switch element is connected to a second gate wiring, and a source electrode and a drain electrode of the second switch element are each connected to one of the plurality of signal wirings.

3. The imaging apparatus according to claim 1, further comprising bias wirings connected to the respective conversion elements, wherein at least one of said bias wirings is connected to at least one of the signal wirings through the second switch element.

4. The imaging apparatus according to claim 3, further comprising a high-resistance element which is arranged outside a region of the pixels, wherein at least one of the first gate wirings is connected through the high-resistance element to at least one of the bias wirings, and the first gate wirings are connected mutually through the high-resistance element.

5. The imaging apparatus according to claim 3, wherein through the second switch element, at least one of the first gate wirings is connected to at least one of the bias wirings, and also the first gate wirings are connected mutually.

6. The imaging apparatus according to claim 1, wherein the conversion element is a photoelectric conversion element, and a scintillator layer is arranged in a region of the pixels and converts the radiation into a light of wavelengths in a region which can be sensed by the photoelectric conversion element.

7. The imaging apparatus according to claim 6, wherein the second switch element is shielded from said light which is emitted from said scintillator layer and is incident on the photoelectric conversion element.

8. A method for driving the imaging apparatus according to claim 1 comprising a step of turning the second switch element off, when driving the imaging apparatus.

9. A radiation imaging system comprising: the imaging apparatus according to claim 1; a signal processing unit for processing a signal sent from the imaging apparatus; a recording unit for recording the signal sent from the signal processing unit; a display unit for displaying the signal sent from the signal processing unit; a transmission processing unit for transmitting the signal sent from the signal processing unit; and a radiation source for generating radiation.

10. A manufacturing method of an imaging apparatus having:
    pixels arranged on a substrate, wherein each of the pixels has a conversion element, and a first switch element connected to the conversion element, a plurality of signal wirings, each connected to the first switch elements in the pixels, and a plurality of second switch elements arranged outside the region of the pixels, wherein each of the plurality of signal wirings is connected with the other signal wirings through the plurality of second switch elements, wherein the method comprises steps of:
    connecting the plurality of signal wirings through connection terminals to a signal processing circuit; and
    forming a light shielding layer over the plurality of second switches, after the step of connecting the plurality of signal wirings to the signal processing circuit.

11. The manufacturing method of an imaging apparatus according to claim 10, wherein the light shielding layer is formed from metal and is connected to a constant potential.

12. The manufacturing method of an imaging apparatus according to claim 10, wherein the light shielding layer is formed from metal and is connected to a GND potential.

13. The manufacturing method of an imaging apparatus according to claim 10, further comprising:
    forming a scintillator layer over a region in which the plurality of pixels are arranged but not over a region in which the plurality of second switching elements are formed, before the step of connecting the plurality of signal wirings through connection terminals to the signal processing circuit.

* * * * *